United States Patent [19]

Masuda

[11] Patent Number: 4,536,667
[45] Date of Patent: Aug. 20, 1985

[54] RESET PULSE GENERATOR

[75] Inventor: Sinichi Masuda, Yao, Japan

[73] Assignee: Sharp Kabushiki Kaisha, Osaka, Japan

[21] Appl. No.: 436,518

[22] Filed: Oct. 25, 1982

[30] Foreign Application Priority Data

Oct. 30, 1981 [JP] Japan .................. 56-162881[U]

[51] Int. Cl.³ .................. H03K 17/22; H03K 17/20; H03K 17/06
[52] U.S. Cl. .................. 307/592; 307/597; 307/296 R; 307/200 A
[58] Field of Search .......... 307/592, 597, 296 R, 307/297, 256, 260, 317 R, 318, 285, 475, 200 A

[56] References Cited

U.S. PATENT DOCUMENTS

| | | | |
|---|---|---|---|
| 4,296,338 | 10/1981 | Thomas | 307/597 X |
| 4,300,065 | 11/1981 | Remedi et al. | 307/296 R X |
| 4,367,422 | 1/1983 | Leslie | 307/592 X |
| 4,367,423 | 1/1983 | Hornung | 307/597 |
| 4,405,871 | 9/1983 | Buurma et al. | 307/597 X |
| 4,429,236 | 1/1984 | Nitschke | 307/608 X |
| 4,433,390 | 2/1984 | Carp et al. | 307/200 A X |
| 4,438,357 | 3/1984 | Wicnieski | 307/597 |

Primary Examiner—Stanley D. Miller
Assistant Examiner—David R. Bertelson
Attorney, Agent, or Firm—Birch, Stewart, Kolasch & Birch

[57] ABSTRACT

A power supply circuit includes a regulator and a smoothing capacitor disposed at the input side of the regulator circuit for supplying power to a microcomputer included in a control system of an electric apparatus. The power supply circuit further includes a series circuit of a Zener diode and a resistor connected to the smoothing capacitor in a parallel fashion. When power supply is initiated, the node provided between the Zener diode and the resistor develops an initial reset pulse which is applied to a reset terminal of the microcomputer for initializing the microcomputer.

3 Claims, 3 Drawing Figures

RESET PULSE GENERATOR

BACKGROUND AND SUMMARY OF THE INVENTION

The present invention relates to a power supply circuit and, more particularly, to a reset pulse generator for developing an initial reset pulse to be applied to a logic circuit such as a microcomputer.

Recently, many kinds of electric apparatus such as a microwave oven employ a microcomputer for controlling an operational mode of the electric apparatus. In such a microcomputer controlled system, the registers included in the microcomputer must be cleared when the power supply switch is switched on. That is, the memory state must be first cleared and, then, a desired program must be conducted. Therefore, an auto clear system is provided to develop an initial reset signal when the power supply switch is switched on.

However, the conventional auto clear system can not ensure a stable operation of the microcomputer. Especially, when a momentary interruption of the electric service occurs, there is a possibility that the initial reset signal is not developed when the electric service is immediately recovered even though the contents of the microcomputer must be cleared to ensure a stable operation.

Accordingly, an object of the present invention is to provide a novel reset pulse generation circuit for developing an initial reset pulse to be applied to a microcomputer included in an electric apparatus such as a microwave oven.

Another object of the present invention is to provide a reset pulse generation circuit included in a power supply circuit, which develops an initial reset pulse even when the electric service is recovered after a momentary interruption of the electric service.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a reset pulse generation circuit is included in a power supply circuit having a regulator circuit. The reset pulse generation circuit includes a series circuit of a Zener diode and a resistor. The thus formed series circuit is connected to a smoothing capacitor included in the regulator circuit in a parallel fashion. The node provided between the Zener diode and the resistor develops an initial reset pulse to be applied to a microcomputer included in an electric apparatus such as a microwave oven.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 1 is a circuit diagram of an example of a conventional reset pulse generation circuit;

FIG. 2 is a circuit diagram of another example of a conventional reset pulse generation circuit.

DESCRIPTION OF THE PREFERRED EMBODIMENTS

Figure 3:
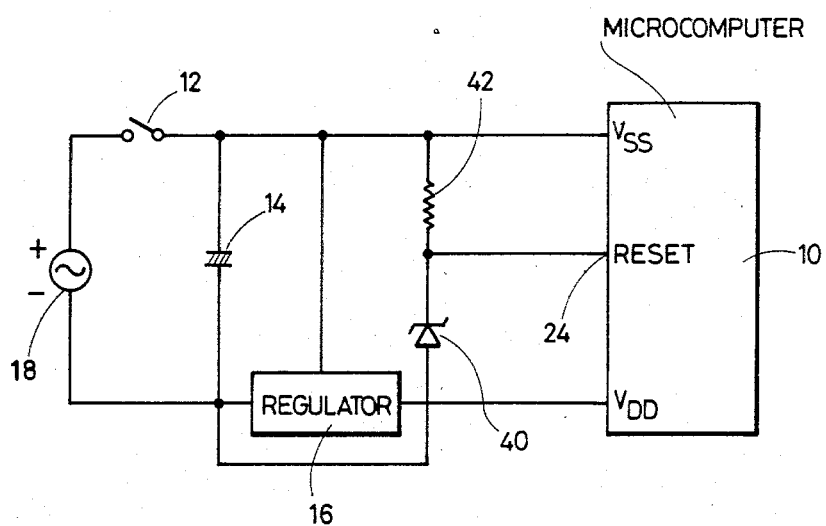
FIG. 3 is a circuit diagram of an embodiment of a reset pulse generation circuit of the present invention.

FIG. 1 shows an example of the conventional reset pulse generation circuit employed in a microwave oven which is controlled by a microcomputer. A microcomputer 10 requires an initial reset signal when a main power supply switch 12 is switched on. The microcomputer 10 is supplied with power through a power supply circuit including a smoothing capacitor 14 and a regulator 16. When the main power supply switch 12 is switched on to connect the power supply circuit to the commercial power supply source 18, a reset pulse generation circuit is operated to develop an initial reset pulse with a predetermined time delay. The reset pulse generation circuit includes a time constant circuit made of a capacitor 20 and a resistor 22. The node provided between the capacitor 20 and the resistor 22 develops the initial reset pulse to be applied to a reset terminal 24 of the microcomputer 10. A diode 26 is connected to the resistor 22 in a parallel fashion for discharging purposes.

When a momentary interruption of the power supply occurs in the circuit of FIG. 1, that is, when the power supply is recovered before the charge stored on the capacitor 20 is sufficiently discharged, a reset pulse of a sufficient level can not be obtained. Accordingly, there is a possibility that the microcomputer 10 operates erroneously.

In order to provide a reset pulse of a sufficient level even when a momentary interruption of the power supply occurs, a reset pulse generation circuit as shown in FIG. 2 has been developed. Like elements corresponding to those of FIG. 1 are indicated by like numerals.

A reset pulse generation circuit of FIG. 2 includes, in addition to the capacitor 20, the resistor 22 and the diode 26, a Zener diode 28, a transistor 30, and resistors 32, 34 and 36. When the power supply is initiated in a normal manner, the time constant circuit including the resistor 22 and the capacitor 20 develops a switching signal with a predetermined time delay. The thus developed switching signal functions to switch on the Zener diode 28 and the transistor 30. The collector electrode of the transistor 30 develops the reset pulse which is forwarded to the reset terminal 24 of the microcomputer 10.

When a momentary interruption of the power supply occurs, that is, when the power supply is recovered before the charge stored on the capacitor 20 is sufficiently discharged, the reset pulse is developed from the transistor 30 without omission. This is because the Zener diode 28 detects the interruption of the power supply even though the power supply is recovered immediately. That is, the transistor 30 is placed in the cutoff state when the power supply is interrupted. The thus formed off state of the transistor 30 is switched to the one state when the power supply is again initiated. Accordingly, the reset pulse of a desired level is applied to the reset terminal 24 of the microcomputer 10 when the power supply is initiated even after the momentary interruption of the electric service.

Although the reset circuit of FIG. 2 ensures a stable operation of the microcomputer 10, a number of circuit elements such as the transistor 30, the capacitor 20, the diode 26, the Zener diode 28 and the resistors 22, 32, 34 and 36 are required.

The present invention is to provide a reset pulse generation circuit with a small number of circuit elements, which ensures a stable operation of the microcomputer 10 even when the momentary interruption of the power supply occurs.

FIG. 3 shows an embodiment of a reset pulse generation circuit of the present invention. Like elements corresponding to those of FIGS. 1 and 2 are indicated by like numerals.

As is well known in the art, the input voltage of the regulator 16 has a higher level than the output voltage thereof by 20% through 40%. A series circuit, which functions as a reset pulse generator, including a Zener diode 40 and a resistor 42 is connected, in a parallel fashion, to the smoothing capacitor 14 which is located at the input side of the regulator 16. The node provided between the Zener diode 40 and the resistor 42 develops a reset pulse to be applied to the reset terminal 24 of the microcomputer 10.

When the power supply is initiated, the output voltage of the regulator 16 reaches a predetermined level in a shorter time than the input voltage of the regulator 16. Therefore, the Zener diode 40 is placed in the ON state slightly after the microcomputer 10 receives a predetermined operation voltage. The node provided between the Zener diode 40 and the resistor 42 develops the reset pulse to be applied to the reset terminal 24 of the microcomputer 10 which has already been placed in an operational mode, the reset pulse having the negative polarity.

When the momentary interruption of the power supply occurs, the Zener diode 40 is immediately placed in the cutoff state even though the microcomputer 10 is still in the operational state. Therefore, when the power supply is recovered in a considerably short time, the Zener diode 40 is switched to the ON state to develop the reset pulse from the node provided between the Zener diode 40 and the resistor 42. That is, the reset pulse is applied to the microcomputer 10 even when the microcomputer 10 is continuously placed in an operative condition during the momentary interruption of the power supply, thereby ensuring an accurate operation of the microcomputer 10.

The reset pulse generation circuit of the present invention is designed especially for the microcomputer controlled microwave oven wherein the microcomputer 10 is preferably made of the LSI "HMC43" manufactured by Hitachi, Ltd., or the LSI "M58845" manufactured by Mitsubishi Denki Kabushiki Kaisha.

The invention being thus described, it will be obvious that the same may be varied in many ways. Such variations are not to be regarded as a departure from the spirit and scope of the invention, and all such modifications are intended to be included within the scope of the following claims.

What is claimed is:

1. In a reset pulse generator circuit in a power supply circuit for developing an initial reset pulse to be applied to the reset terminal of a logic circuit, said power supply including a source of electrical power, a regulator circuit having an input side connected to said source of electrical power and an output side for supplying a regulated voltage to said logic circuit, the improvement comprising:

a series circuit including a Zener diode and a resistor joined by a common node; said node being directly connected to the reset terminal of said logic circuit, one end of said resistor and one terminal of said Zener diode; the other end of said resistor being connected to one side of said source of electrical power; and the other terminal of said Zener diode being connected to the input side of said voltage regulator and the opposite side of said source of electrical power, said Zener diode being reverse biased to preclude the conduction thereof during steady state operation of said power supply circuit; and trigger means for forward biasing said Zener diode to generate said initial reset pulse at said node when said power supply suddenly goes fron an OFF to an ON state.

2. The reset pulse generator circuit of claim 1, wherein said trigger means comprises a smoothing capacitor connected in parallel with said source of electrical power and said Zener diode;

whereby a sudden application of voltage across said smoothing capacitor generates a trigger voltage which forward biases said Zener diode.

3. The reset pulse generation circuit of claim 2, wherein said logic circuit comprises a microcomputer.

* * * * *